(12) United States Patent
Thakar et al.

(10) Patent No.: US 10,849,223 B2
(45) Date of Patent: Nov. 24, 2020

(54) MULTI-SOCKET SERVER ASSEMBLY

(71) Applicant: Cisco Technology, Inc., San Jose, CA (US)

(72) Inventors: Anant Thakar, Los Altos, CA (US); Jayaprakash Balachandran, Fremont, CA (US); Daniel Bernard Hruska, San Carlos, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/294,277

(22) Filed: Mar. 6, 2019

(65) Prior Publication Data
US 2020/0288571 A1 Sep. 10, 2020

(51) Int. Cl.
*H05K 1/11* (2006.01)
*H05K 5/02* (2006.01)

(52) U.S. Cl.
CPC ............. *H05K 1/11* (2013.01); *H05K 5/0269* (2013.01); *H05K 5/0291* (2013.01); *H05K 2201/10325* (2013.01)

(58) Field of Classification Search
CPC ................... H05K 1/11; H05K 5/0291; H05K 2201/10325
See application file for complete search history.

(56) References Cited

U.S. PATENT DOCUMENTS

| 7,256,992 B1 | 8/2007 | Stewart et al. |
| 7,965,509 B2 | 6/2011 | Campbell et al. |
| 8,866,023 B2 * | 10/2014 | Kadri ..................... G11C 5/066 174/261 |
| 9,158,348 B2 | 10/2015 | Berk et al. |
| 9,818,457 B1 | 11/2017 | Querbach et al. |
| 2007/0121286 A1 * | 5/2007 | Foster, Sr. ................ G06F 1/20 361/679.46 |
| 2012/0001763 A1 * | 1/2012 | Billick .................. G06F 15/177 340/635 |
| 2015/0173194 A1 | 6/2015 | Pymento et al. |
| 2017/0010628 A1 * | 1/2017 | Byers ....................... H05K 1/14 |
| 2017/0293328 A1 * | 10/2017 | Ning ......................... G06F 1/20 |
| 2018/0196763 A1 | 7/2018 | Fahmy |
| 2018/0357108 A1 | 12/2018 | Mullender et al. |
| 2019/0042516 A1 | 2/2019 | Browning et al. |

OTHER PUBLICATIONS

International Search Report and Written Opinion from the International Searching Authority, dated May 13, 2020, 12 pages, for corresponding International Patent Application No. PCT/US2020/020685.

* cited by examiner

*Primary Examiner* — Binh B Tran
*Assistant Examiner* — Hiram E Gonzalez
(74) *Attorney, Agent, or Firm* — Polsinelli PC

(57) ABSTRACT

In some examples, a printed circuit board assembly can include a printed circuit board having four (4) central processor unit (CPU) sockets disposed thereon and sixty four (64) dual in-line memory modules (DIMMs) disposed thereon. The printed circuit board can have a top surface and a bottom surface with two (2) CPU sockets and thirty two (32) DIMMs disposed on the top surface and two (2) CPU sockets and thirty two (32) DIMMs disposed on the bottom surface.

20 Claims, 6 Drawing Sheets

US 10,849,223 B2

MULTI-SOCKET SERVER ASSEMBLY

TECHNICAL FIELD

The present disclosure relates generally to server assemblies.

BACKGROUND

Server assembles, such as blade servers, seek to implement as much computer processing power as possible within a defined space. Blade servers having four processor sockets can be implemented in 7U or 10U arrangements, but suffer from efficient thermal cooling, connectivity, and appropriate form factors to maximize processor power within a server rack assembly.

DESCRIPTION OF EXAMPLE EMBODIMENTS

Overview

Figure 1:
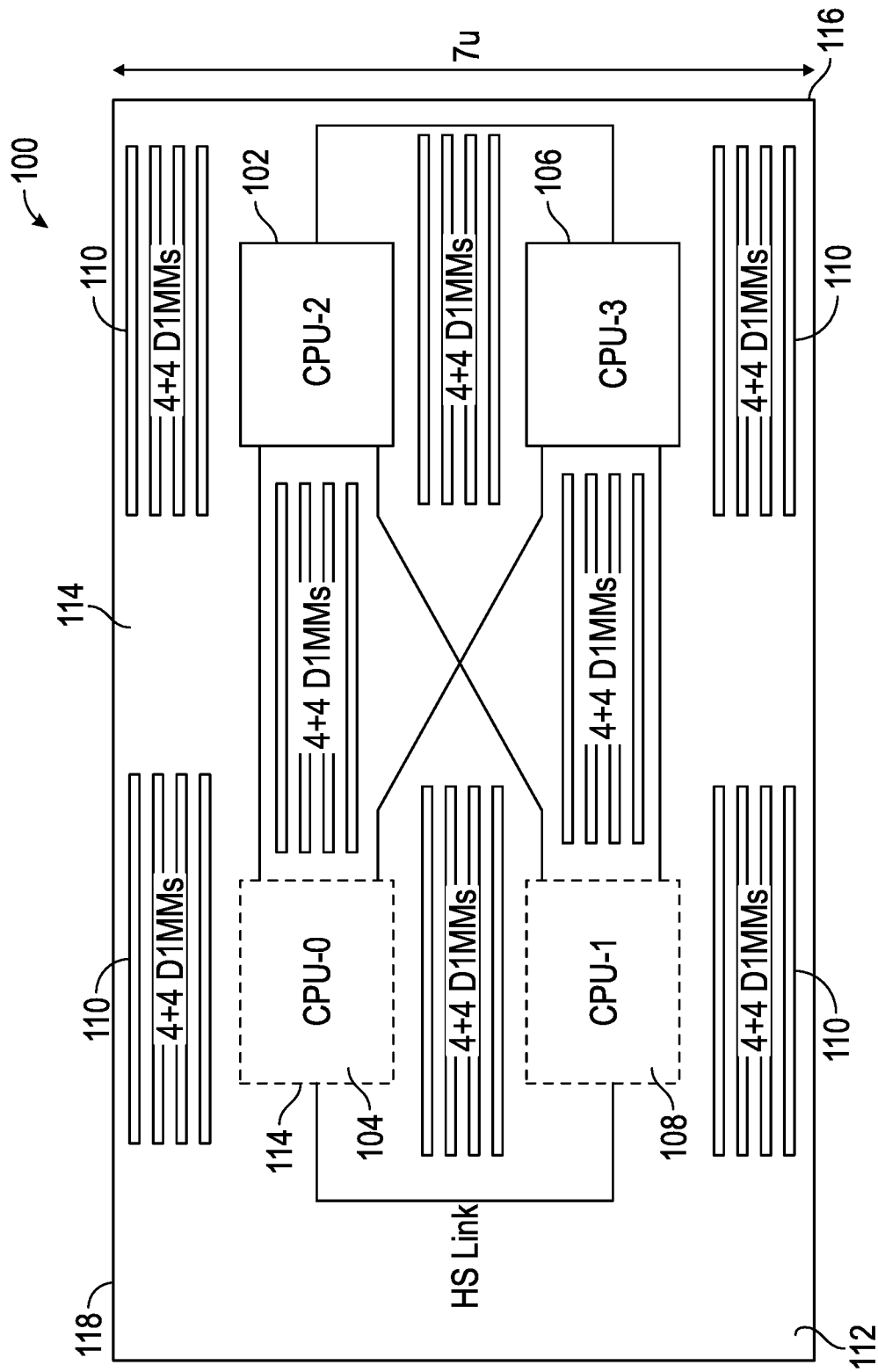
FIG. 1 illustrates a diagrammatic view of a four socket server printed circuit board (PCB), according to at least on example of the present disclosure.

A server assembly for implementing a four processor socket printed circuit board (PCB) within a 7U (rack unit) form factor is described herein. The server assembly can have a PCB having four central processor unit (CPU) sockets disposed thereon and sixty four dual in-line memory modules disposed thereon. The PCB can have a top surface and a bottom surface with the top surface having two CPU sockets and thirty two DIMMs disposed thereon and the bottom surface having two CPU sockets and thirty two DIMMs disposed thereon.

Example Embodiments

The present disclosure is described with reference to the attached figures, wherein like reference numerals are used throughout the figures to designate similar or equivalent elements. The figures are not drawn to scale and they are provided merely to illustrate the instant technologies. Several aspects of the disclosure are described below with reference to example applications for illustration. It should be understood that numerous specific details, relationships, and methods are set forth to provide a full understanding of the disclosure. One having ordinary skill in the relevant art, however, will readily recognize that aspects of the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Several definitions that apply throughout this disclosure will now be presented. The terms "comprising," "including" and "having" are used interchangeably in this disclosure. The terms "comprising," "including" and "having" mean to include, but are not necessarily limited to, the things so described.

The term "coupled with" is defined as connected, either directly or indirectly through intervening components, and the connections are not necessarily limited to physical connections, but are connections that accommodate the transfer of data between the so-described components. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder.

FIG. 1 details a printed circuit board according to the present disclosure. A printed circuit board 100 can be operable to be disposed within a 7U server assembly (e.g. a blade server). The printed circuit board (PCB) 100 can have four (4) central processor unit (CPU) sockets 102, 104, 106, 108 disposed thereon. Each of the CPU sockets 102, 104, 106, 108 can be operable to communicatively receive a CPU therein.

The PCB 100 can have sixty four (64) dual in-line memory modules (DIMMs) 110 disposed thereon and communicatively coupled with at least a portion of the four CPU sockets 102, 104, 106, 108. In at least one instance, each CPU socket 102, 104, 106, 108 can be communicatively coupled with sixteen (16) DIMMs 110.

The PCB 100 can have a top surface 112 and a bottom surface 114 with the top surface 112 having two (2) CPU sockets 102, 104 and thirty two (32) DIMMs 110 disposed thereon and the bottom surface 114 having two (2) CPU sockets 106, 108 and thirty two (32) DIMMs 110 disposed thereon.

The top surface 112 can have two CPU sockets 102, 104 disposed proximal for a first edge 116 of the PCB 100. The bottom surface 114 can have two CPU sockets 106, 108 disposed proximal to a second edge 118 of the PCB 100. The two CPU sockets 102, 106 disposed on the top surface 112 and the two CPU sockets 104, 108 disposed on the bottom surface 114 can be longitudinally displaced from one another relative to the first edge 116 and the second edge 118. Further, the two CPU sockets 102, 106 on the top surface 112 can be laterally displaced from one another relative to the first edge 116 and the two CPU sockets 104, 108 on the bottom surface 114 can be laterally displaced from one another relative to the second edge 118. The lateral displacement can place CPU sockets 102, 106 and CPU 104, 108 substantially in parallel with respect to an applied cooling airflow across the PCB 100. The longitudinal and lateral displacements of CPU sockets 102, 104, 106, 108 relative to one another can improve the thermal efficiency of the PCB 100 by improving cooling airflow across the PCB and prevent serial heating of the cooling airflow from one CPU socket to another.

The lateral displacement of CPU sockets 102, 106 from CPU sockets 104, 108 can improve thermal efficiency of the server assembly by reducing serial heating. Airflow passing over the PCB 100 to draw heat generated by a CPU in the CPU sockets 102, 104, 106, 108 is prevented from passing over one CPU socket 102, 104, 106, 108 and then subsequently passing over another CPU socket 102, 104, 106, 108 with preheated air. In at least one instance, cooling airflow can pass from the first edge 116 to the second edge 118, thus drawing heat away from the CPU sockets 102, 104, 106, 108. In a serially arranged CPU socket arrangement, airflow across a first CPU socket can heat the cooling air to a temperature above inlet temperature before passing over a subsequent CPU socket. The heated air has a reduced capacity to draw heat away from the subsequent CPU socket, thereby reducing the thermal efficiency of the PCB.

The lateral displacement of CPU sockets 102, 106 on the top surface 112 and CPU sockets 104, 108 on the bottom surface 114 can prevent serial heating as a cooling airflow is placed across the PCB. Further the longitudinal displacement of CPU sockets 102, 106 on the top surface 112 and CPU sockets 104, 108 on the bottom surface can prevent substantially aligned and/or overlapping heating of the PCB 100.

The thirty two DIMMs 110 disposed on the top surface 112 can substantially align and/or overlap with the thirty two DIMMs 110 disposed on the bottom surface 114. As described in more detail with respect to FIG. 4 and FIG. 5, the substantially aligned and/or overlapping DIMMs 110 can reduce required coupling to at least one CPU socket 102, 104, 106, 108.

Figure 4:
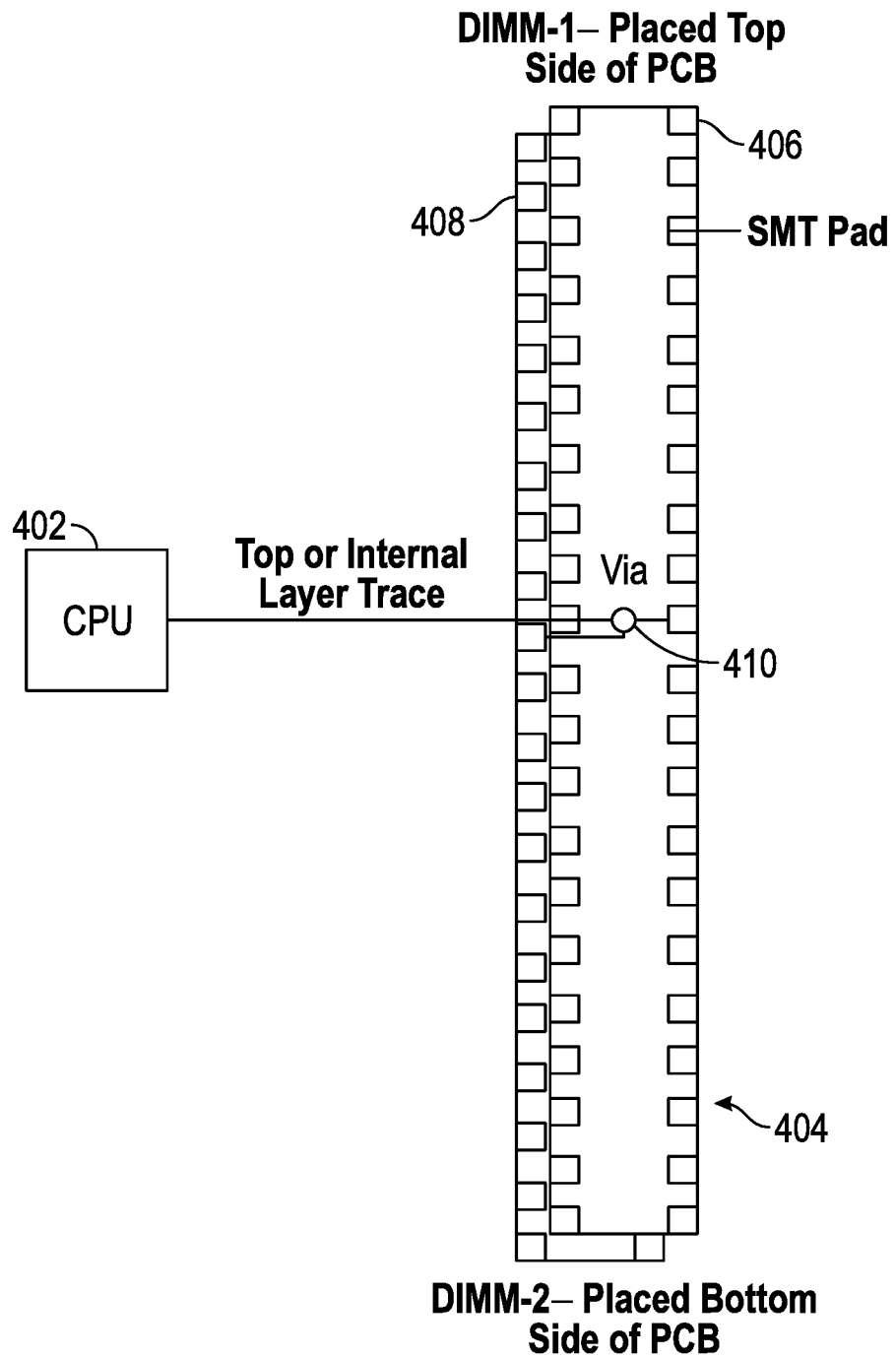
FIG. 4 illustrates a diagrammatic view of a processor arranged with two dual in-line memory modules (DIMMs) coupled therewith, according to at least one example of the present disclosure.

As described with more detail with respect to FIG. 4, the arrangement of CPU sockets 102, 104, 106, 108 and DIMMs 110 disposed simultaneously on the top surface 112 and the bottom surface 114 of the PCB 100 can allow for thicker PCB 100 manufacturing while reducing the needed layers, thereby reducing manufacturing costs.

Figure 2:
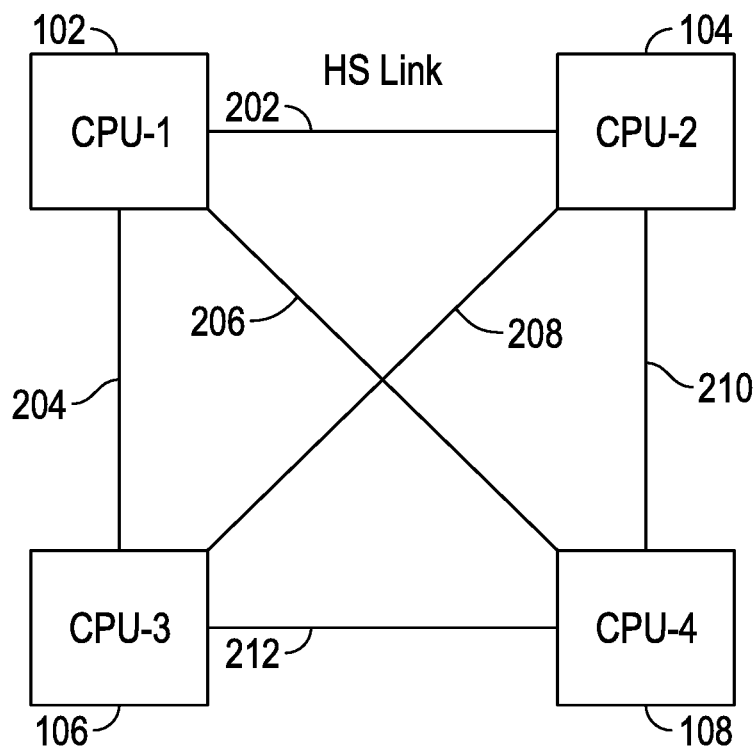
FIG. 2 illustrates a diagrammatic view of a four processor arrangement having three high speed links, according to at least one example of the present disclosure.

FIG. 2 details a four CPU socket arrangement having three high speed links between each of the four CPU sockets. The PCB 100 having four CPU sockets 102, 104, 106, 108 disposed thereon can have one high speed links to each of the other CPU sockets 102, 104, 106, 108.

CPU socket 102 can have three high speed links providing high speed coupling to each of the other CPU sockets 104, 106, 108. Communication channel 202 can provide high speed coupling with CPU socket 104, while communication channel 204 can provide high speed coupling with CPU socket 106 and communication channel 206 can provide high speed coupling with CPU socket 108.

CPU socket 104 can have three high speed links providing high speed coupling to each of the other CPU sockets 102, 106, 108. Communication channel 202 can provide high speed coupling with CPU socket 102, while communication channel 208 can provide high speed coupling with CPU socket 106 and communication channel 210 can provide high speed coupling with CPU socket 108.

CPU socket 106 can have three high speed links providing high speed coupling to each of the other CPU sockets 102, 104, 108. Communication channel 204 can provide high speed coupling with CPU socket 102, while communication channel 208 can provide high speed coupling with CPU socket 104 and communication channel 212 can provide high speed coupling with CPU socket 108.

CPU socket 108 can have three high speed links providing high speed coupling to each of the other CPU sockets 102, 104, 106. Communication channel 206 can provide high speed coupling with CPU socket 102, while communication channel 210 can provide high speed coupling with CPU socket 104 and communication channel 212 can provide high speed coupling with CPU socket 106.

Figure 3:
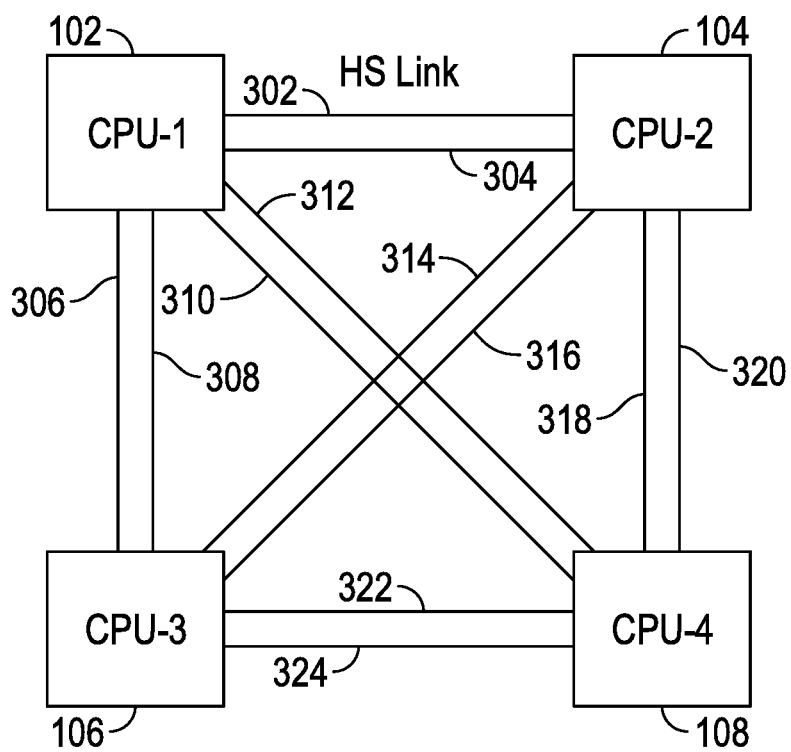
FIG. 3 illustrates a diagrammatic view of a four processor arrangement having six high speed links, according to at least one example of the present disclosure.

FIG. 3 details a four CPU socket arrangement having six high speed links between each of the four CPU sockets. The PCB 100 having four CPU sockets 102, 104, 106, 108 disposed thereon can have two high speed links to each of the other CPU sockets 102, 104, 106, 108.

CPU socket 102 can have six high speed links providing high speed coupling to each of the other CPU sockets 104, 106, 108. Communication channels 302, 304 can provide high speed coupling with CPU socket 104, while communication channels 306, 308 can provide high speed coupling with CPU socket 106 and communication channels 310, 312 can provide high speed coupling with CPU socket 108.

CPU socket 104 can have six high speed links providing high speed coupling to each of the other CPU sockets 102, 106, 108. Communication channel 302, 304 can provide high speed coupling with CPU socket 102, while communication channel 314, 316 can provide high speed coupling with CPU socket 106 and communication channels 318, 320 can provide high speed coupling with CPU socket 108.

CPU socket 106 can have six high speed links providing high speed coupling to each of the other CPU sockets 102, 104, 108. Communication channels 306, 308 can provide high speed coupling with CPU socket 102, while communication channels 314, 316 can provide high speed coupling with CPU socket 104 and communication channels 322, 324 can provide high speed coupling with CPU socket 108.

CPU socket 108 can have six high speed links providing high speed coupling to each of the other CPU sockets 102, 104, 106. Communication channels 310, 312 can provide high speed coupling with CPU socket 102, while communication channels 318, 320 can provide high speed coupling with CPU socket 104 and communication channels 322, 324 can provide high speed coupling with CPU socket 106.

FIG. 4 details a CPU socket coupled with two DIMMs. A CPU socket 402 can be coupled with sixteen DIMMs 404, each DIMM 404 operable to receive memory modules therein. The PCB (shown in FIG. 1) can be arranged to provide thirty two DIMMs 404 on a top surface and thirty two DIMMs 404 on a bottom surface to maximize spacial efficiency on the PCB. The CPU socket 402 can be operably coupled with eight DIMMs 404 on the top surface and eight DIMMs 404 on the bottom surface with the DIMMs 404 substantially aligned and/or overlapping. The substantially aligned and/or overlapping arrangement of the DIMMs 404 can allow each CPU socket 402 to have a single communication channel with one via two DIMMs 404 respectively.

The single via arrangement with two DIMMs 404 can significantly reduce cross talk as well as impedance discontinuity while allowing each DIMM 404 to achieve speeds in excess of 3200 Mbps in a two DIMM per channel (DPC) arrangement. A communication channel having two vias communicatively coupling two DIMMs typically limits speeds to 2933 Mbps for a two DPC arrangement.

The single via arrangement provide by implement thirty two DIMMs 404 on a top surface of the PCB and simultaneously implementing thirty two DIMMs 404 on a bottom surface of the PCB substantially aligned and/or overlapping with the DIMMs 404 of the top surface can enable a thicker PCB, thus allowing additional layers as needed. PCBs having a two via arrangement can be limited to approximately 120 mils thickness, which in turn limits the number of layers and limits the number of I/O (e.g. PCIe) links that can be routed on the PCB.

The single via implementation can reduce manufacturing cost while improving yield. In at least some examples, the overall layer count can be reduced by approximately four layers based on the reduced via implementation.

Figure 5:
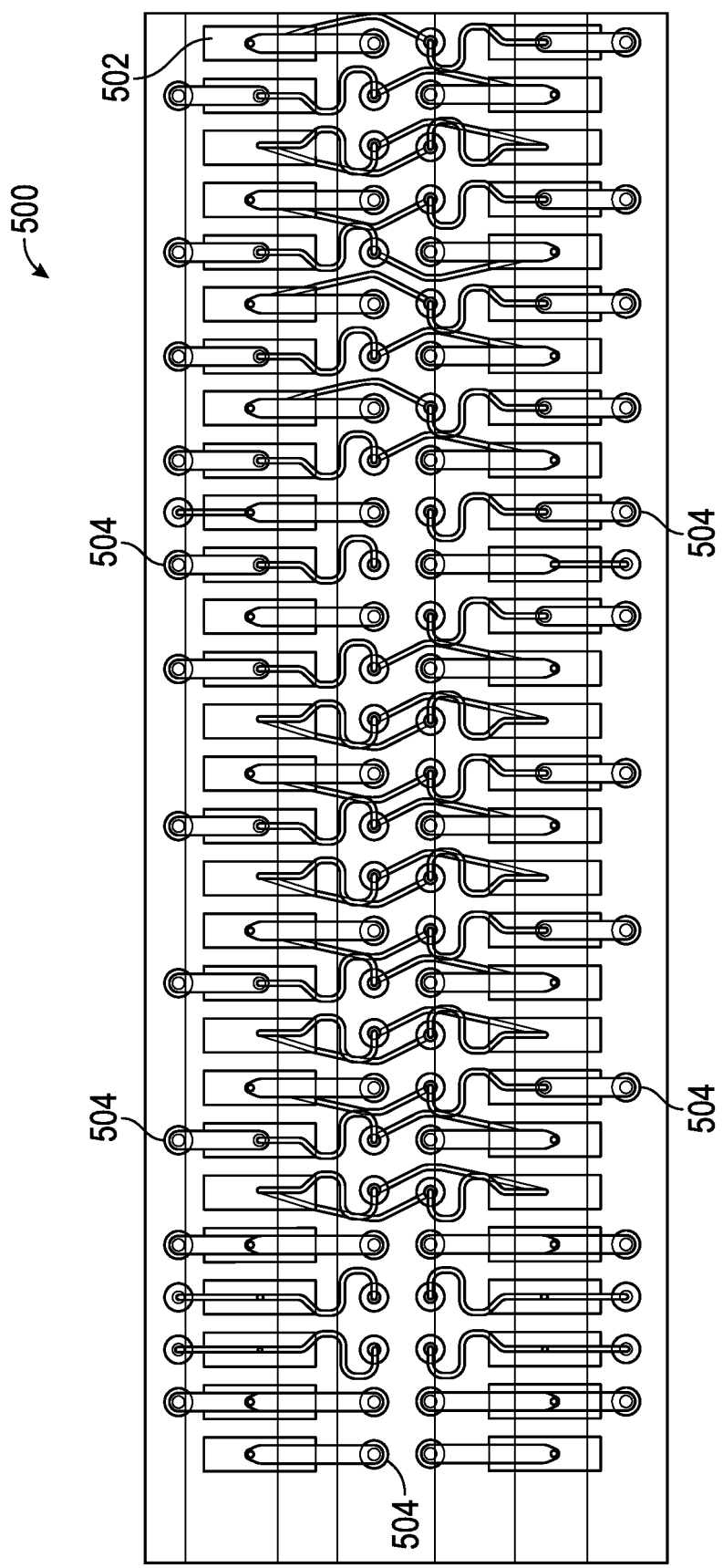
FIG. 5 illustrates diagrammatic view of a PCB arrangement having sixty four (64) DIMMs, according to at least one example of the present disclosure.

FIG. 5 details a single via implementation for a PCB. The single via implementation 500 can provide each DIMM 502 a communication channel to a CPU socket using on a single via 504. The single via implementation can improve signal integrity, reduce crosstalk and impedance discontinuity, while enabling DIMM 502 speeds in excess of 3200 Mbps in a two DPC configuration.

Figure 6:
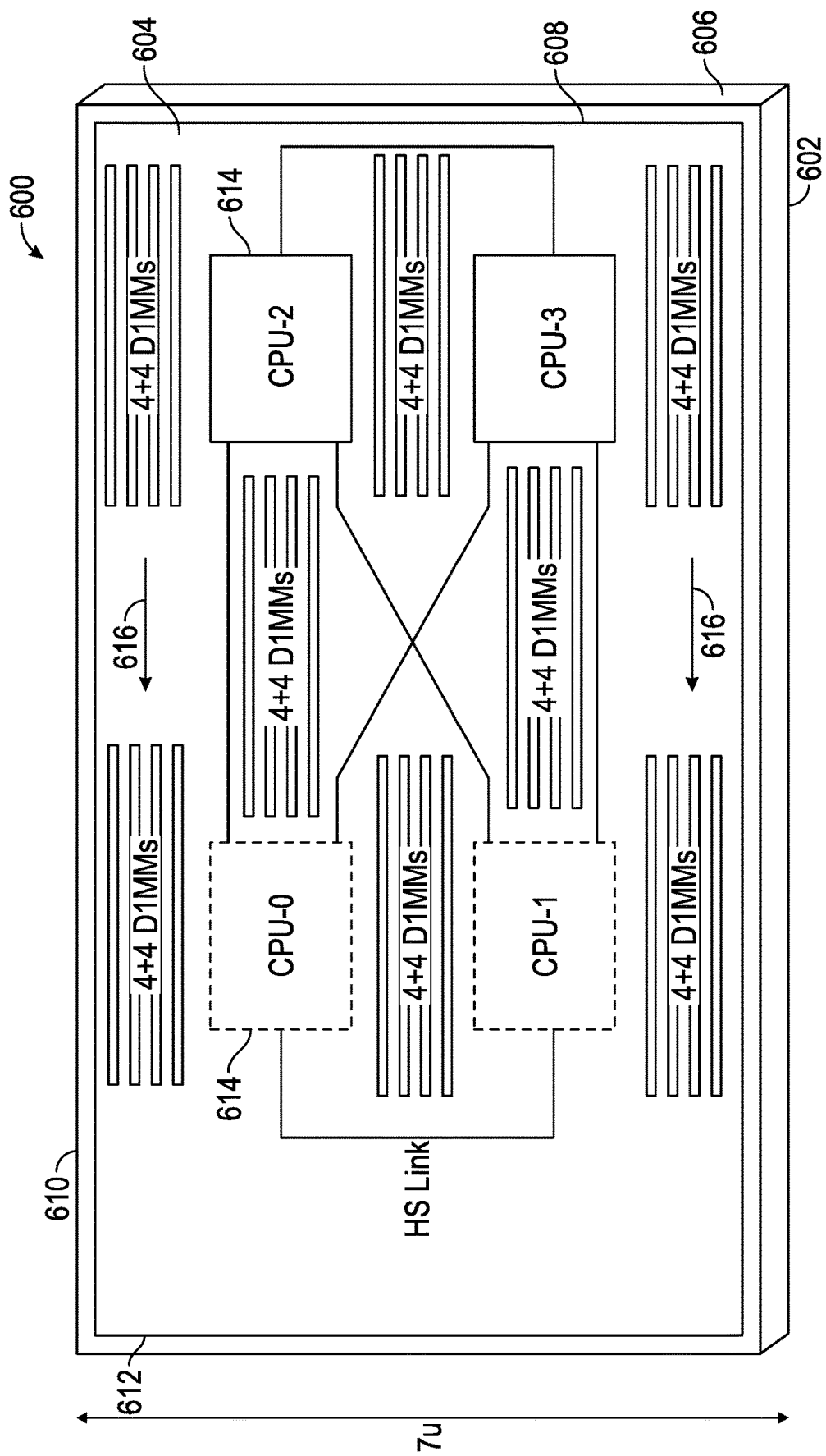
FIG. 6 illustrates an isometric view of a 7U four socket server assembly, according to at least one example of the present disclosure.

FIG. 6 details a server assembly having a four CPU socket printed circuit board received therein. The server assembly 600 can have a housing 602 operable to receive a PCB 604 therein. The housing 602 can be have an air inlet 606 along one side surface 608 and an air outlet 610 formed along another side surface 612.

The air inlet 606 and the air outlet 610 can collectively form an airflow path 616 through the housing 602 and across the PCB 604. The air inlet 606 can be operable to draw an airflow into the housing 602 while the air outlet 610 can be operable to allow the airflow to exit the housing after being drawn across the PCB 604. As the airflow passes over the PCB 604, the airflow can absorb heat rejected by the CPU sockets 614, thereby cooling the CPU sockets 614 and heating the airflow. The heated airflow can be exhausted and/or ejected from the housing 602 via the air outlet 610.

The airflow can be generated by one or more fans coupled with one of the air inlet 606 and/or the air outlet 610. The one or more fans can be operable to generate the airflow path 616 by pulling and/or pushing air across the PCB 604 depending on the particular arrangement relative to the air inlet 606 and/or the air outlet 610.

The CPU sockets 614 can be arranged on both a top surface and a bottom surface of the PCB 604 and the airflow path 616 is arranged to pass over both the top surface and the bottom surface. The PCB 604 can have four CPU sockets 614 disposed thereon, two on the top surface and two on the bottom surface of the PCB 604 and arranged so that the airflow path 616 passes across the two CPU sockets 614 disposed on each respective surface in parallel, thereby prevent serially heating of the airflow through the housing 602. The airflow path 616 can direct the airflow through the housing 602 and across the two CPU sockets 614 on a respective surface substantially simultaneously, thereby maximizing the thermal efficiency of the server assembly 600. The airflow path 616 should not cross over first CPU socket 614 before subsequently passing over a second CPU socket 614 (e.g. serial cooling, shadow core) as the second CPU would see decreased cooling capacity from the already heated airflow.

The spread (e.g. parallel, lateral displacement) CPU socket 614 arrangement can support higher CPU wattage because of the increased cooling capacity and thermal efficiency of the spread CPU socket 614 layout.

While the FIG. 6 illustrates a substantially linear airflow path across the PCB 604, it is within the scope of this disclosure to implement any airflow path operable to provide cooling of the CPU sockets 614 in a substantially parallel arrangement, as described above.

In at least one instance, the PCB 604 can be substantially centrally arranged within the housing 602 being substantially evenly spaced from a top surface and a bottom surface of the housing 602, thereby allowing a substantially symmetric airflow path 616 across the top surface and the bottom surface of the PCB 604.

The housing 602 can be operable to have an approximately 7U size while having four CPU sockets 614 and sixty four DIMMs 618 disposed on a single PCB 604, thereby maximizing the processing power of a four CPU socket 614 PCB 604 within a small form factor. The housing 7U form factor can allow more server assemblies 600 to be implemented within a server rack assembly (not shown), thereby increasing processing power density while maintaining thermal efficiency and space utilization.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Also, the terms "about", "substantially", and "approximately", as used herein with respect to a stated value or a property, are intend to indicate being within 20% of the stated value or property, unless otherwise specified above. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 7:
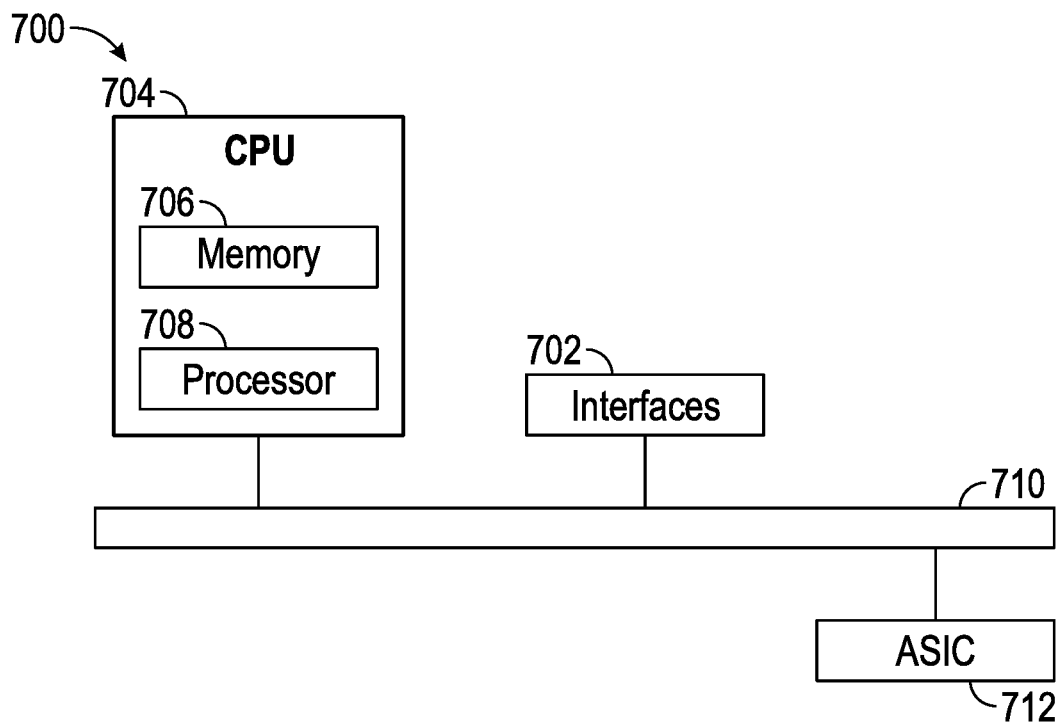
FIG. 7 illustrates an example network device according to at least one example of the present disclosure.
Figure 8:
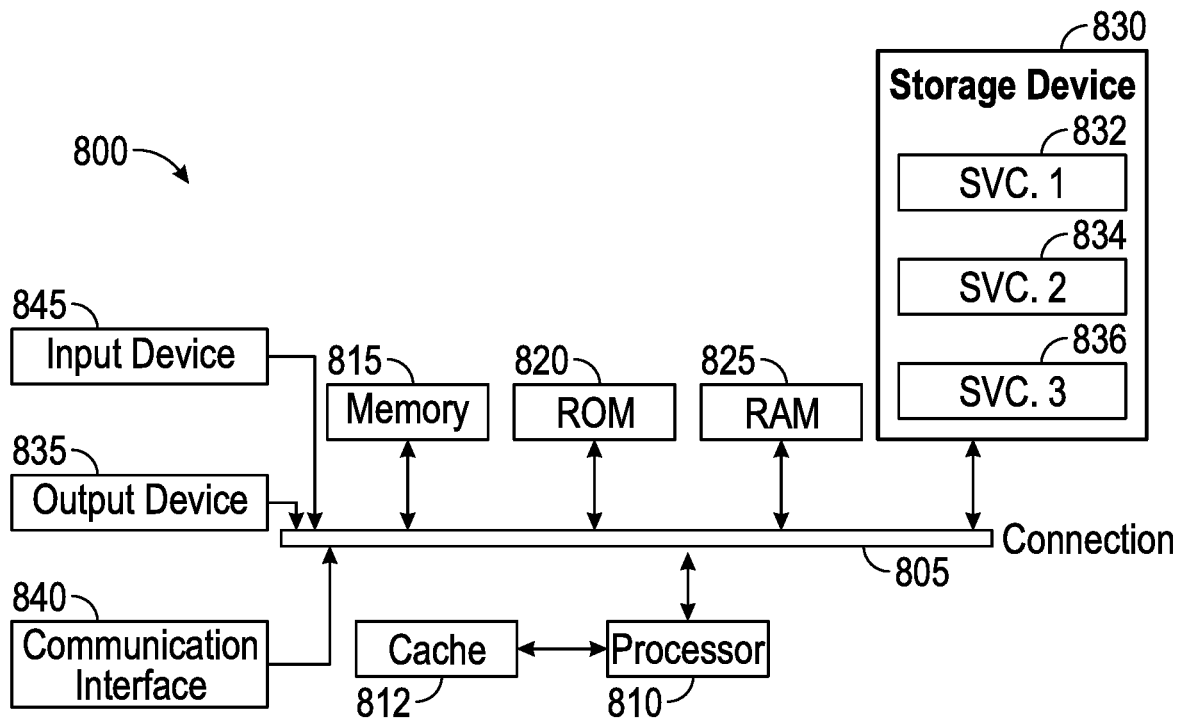
FIG. 8 illustrates an example computing device architecture according to at least one example of the present disclosure.

The disclosure now turns to FIGS. 7 and 8, which illustrate example network devices and computing devices, such as switches, routers, client devices, endpoints, servers, and so forth.

FIG. 7 illustrates an example network device 700 suitable for implementing one or more aspects of the present disclosure. Network device 700 includes a central processing unit (CPU) 704, interfaces 702, and a connection 710 (e.g., a PCI bus). When acting under the control of appropriate software or firmware, the CPU 704 is responsible for executing packet management, error detection, and/or routing functions. The CPU 704 preferably accomplishes all these functions under the control of software including an operating system and any appropriate applications software. CPU 704 may include one or more processors 707, such as a processor from the INTEL X86 family of microprocessors. In some cases, processor 708 can be specially designed hardware for controlling the operations of network device 700. In some cases, a memory 706 (e.g., non-volatile RAM, ROM, etc.)

also forms part of CPU 704. However, there are many different ways in which memory could be coupled to the system.

The interfaces 702 are typically provided as modular interface cards (sometimes referred to as "line cards"). Generally, they control the sending and receiving of data packets over the network and sometimes support other peripherals used with the network device 700. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces, WIFI interfaces, 3G/4G/5G cellular interfaces, CAN BUS, LoRA, and the like. Generally, these interfaces may include ports appropriate for communication with the appropriate media. In some cases, they may also include an independent processor and, in some instances, volatile RAM. The independent processors may control such communications intensive tasks as packet switching, media control, signal processing, crypto processing, and management. By providing separate processors for the communications intensive tasks, these interfaces allow the master microprocessor 704 to efficiently perform routing computations, network diagnostics, security functions, etc.

Although the system shown in FIG. 7 is one specific network device according to some examples of the present technologies, it is by no means the only network device architecture on which the present technologies can be implemented. For example, an architecture having a single processor that handles communications as well as routing computations, etc., is often used. Further, other types of interfaces and media could also be used with the network device 700.

Regardless of the network device's configuration, it may employ one or more memories or memory modules (including memory 706) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc. Memory 706 could also hold various software containers and virtualized execution environments and data.

The network device 700 can also include an application-specific integrated circuit (ASIC) 712, which can be configured to perform routing and/or switching operations. The ASIC 712 can communicate with other components in the network device 700 via the connection 710, to exchange data and signals and coordinate various types of operations by the network device 700, such as routing, switching, and/or data storage operations, for example.

FIG. 8 illustrates a computing system architecture 800 wherein the components of the system are in electrical communication with each other using a connection 805, such as a bus. Exemplary system 800 includes a processing unit (CPU or processor) 810 and a system connection 805 that couples various system components including the system memory 815, such as read only memory (ROM) 820 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other system memory 815 may be available for use as well. The memory 815 can include multiple different types of memory with different performance characteristics. The processor 810 can include any general purpose processor and a hardware or software service, such as service 1 832, service 2 834, and service 3 836 stored in storage device 830, configured to control the processor 810 as well as a special-purpose processor where software instructions are incorporated into the actual processor design. The processor 810 may be a completely self-contained computing system, containing multiple cores or processors, a bus, memory controller, cache, etc. A multi-core processor may be symmetric or asymmetric.

To enable user interaction with the computing device 800, an input device 845 can represent any number of input mechanisms, such as a microphone for speech, a touch-sensitive screen for gesture or graphical input, keyboard, mouse, motion input, speech and so forth. An output device 835 can also be one or more of a number of output mechanisms known to those of skill in the art. In some instances, multimodal systems can enable a user to provide multiple types of input to communicate with the computing device 800. The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof.

The storage device 830 can include services 832, 834, 836 for controlling the processor 810. Other hardware or software modules are contemplated. The storage device 830 can be connected to the system connection 805. In one aspect, a hardware module that performs a particular function can include the software component stored in a computer-readable medium in connection with the necessary hardware components, such as the processor 810, connection 805, output device 835, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments, computer-readable storage devices, media, and memories can include a cable or wireless signal containing a bit stream and the like. However, when mentioned, non-transitory computer-readable storage media expressly exclude media such as energy, carrier signals, electromagnetic waves, and signals per se.

Devices implementing technologies and computing functionality according to these disclosures can comprise hardware, firmware and/or software, and can take any of a variety of form factors. Some examples of such form factors include laptops, smart phones, small form factor personal computers, personal digital assistants, rackmount devices, standalone devices, and so on. Computing functionality can also be embodied in peripherals or add-in cards and circuit boards among different chips or different processes executing in a device, by way of example.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" a set indicates that one member of the set or multiple members of the set satisfy the claim. For example, claim language reciting "at least one of A and B" means A, B, or A and B.

What is claimed is:

1. A printed circuit board comprising:
a top surface and a bottom surface;
a plurality of processor sockets disposed on the printed circuit board;
a first plurality of dual in-line memory modules (DIMMs) disposed on the top surface; and
a second plurality of DIMMs disposed on the bottom surface;
wherein a first contact area of each DIMM in the first plurality of DIMMs and a second contact area of each DIMM in the second plurality of DIMMs have a respective overlapping alignment along a vector that is perpendicular to a plane of the printed circuit board, wherein each pair of DIMMs associated with the first contact area and the second contact area having the respective overlapping alignment is connected to a respective processor through a single via.

2. The printed circuit board of claim 1, wherein each pair of DIMMs comprises a first DIMM and a second DIMM having the first contact area and the second contact area with the respective overlapping alignment.

3. The printed circuit board of claim 2, wherein each processor socket is coupled with one or more pairs of DIMMs comprise a number of DIMMs disposed on the top surface and the number of DIMMs disposed on the bottom surface.

4. The printed circuit board of claim 2, wherein each pair of DIMMs is coupled with the respective processor socket by a single channel.

5. The printed circuit board of claim 1, wherein one or more processor sockets disposed on the top surface are longitudinally displaced from one or more processor sockets disposed on the bottom surface.

6. The printed circuit board of claim 1, wherein one or more processor sockets disposed on the top surface are laterally displaced, one from one or more other processor sockets and one or more processor sockets disposed on the bottom surface are laterally displaced from one or more different processor sockets.

7. The printed circuit board of claim 6, wherein a cooling path extends longitudinally across the printed circuit board, thus laterally displaced processor sockets interact with the cooling path.

8. The printed circuit board of claim 1, wherein the plurality of processor sockets comprises at least 4 sockets, wherein the first plurality of DIMMs comprises at least 32 DIMMs and the second plurality of DIMMs comprises at least 32 DIMMs, the printed circuit board being housed in a 7U housing.

9. The printed circuit board of claim 1, wherein each processor socket in the plurality of processor sockets has a plurality of high speed links, each high speed link coupling the processor socket with each remaining processor socket in the plurality of processor sockets.

10. The printed circuit board of claim 1, wherein each processor socket in the plurality of processor sockets has a plurality of high speed links and wherein each processor socket is coupled with each remaining processor socket in the plurality of processor sockets via two high speed links from the plurality of high speed links.

11. A system assembly comprising:
a housing; and
a printed circuit board within the housing, the printed circuit board comprising:
a top surface and a bottom surface;
a plurality of processor sockets disposed on the printed circuit board;
a first plurality of dual in-line memory modules (DIMMs) disposed on the top surface; and
a second plurality of DIMMs disposed on the bottom surface;
wherein a first contact area of each DIMM in the first plurality of DIMMs and a second contact area of each DIMM in the second plurality of DIMMs have a respective overlapping alignment along a vector that is perpendicular to a plane of the printed circuit board, wherein each set of DIMMs associated with the first contact area and the second contact area having the respective overlapping alignment is connected to a respective processor through a single via.

12. The system assembly of claim 11, wherein each set of DIMMs comprises a first DIMM and a second DIMM having the first contact area and the second contact area with the respective overlapping alignment.

13. The system assembly of claim 12, wherein each processor socket is coupled with one or more sets of DIMMs comprising a number of, DIMMs disposed on the top surface and the number of DIMMs disposed on the bottom surface.

14. The system assembly of claim 12, wherein each set of DIMMs is coupled with the respective processor socket by a single channel.

15. The system assembly of claim 11, wherein the first plurality of processor sockets on the top surface are longitudinally displaced from the second plurality of processor sockets on the bottom surface.

16. The system assembly of claim 11, wherein the first plurality of processor sockets on the top surface are laterally displaced from each other and the second plurality of processor sockets on the bottom surface are laterally displaced from each other.

17. The system assembly of claim 16, wherein a cooling path extends longitudinally across the printed circuit board, thus laterally displaced processor sockets interact with the cooling path.

18. The system assembly of claim 11, wherein each processor socket in the first plurality of processor sockets and in the second plurality of processor sockets has a plurality of high speed links, each high speed link coupling each processor socket with each remaining processor socket in the first plurality of processor sockets and the second plurality of processor sockets.

19. The system assembly of claim 11, wherein each processor socket in the first plurality of processor sockets and the second plurality of sockets has a plurality of high speed links, each two high speed links coupling the processor socket with each remaining processor socket in the first plurality of processor sockets and the second plurality of processor sockets.

20. The system assembly of claim 11, further comprising an airflow path arranged to pass over both the top surface and the bottom surface.

* * * * *